(12) United States Patent
Lemke

(10) Patent No.: US 9,462,695 B2
(45) Date of Patent: Oct. 4, 2016

(54) POWER SEMICONDUCTOR DEVICE

(71) Applicant: Semikron Elektronik GmbH & Co., KG, Nürnberg (DE)

(72) Inventor: Peter Lemke, Schwabach (DE)

(73) Assignee: Semikron Elektronik GmbH & Co., KG, Nürnberg (DE)

( * ) Notice: Subject to any disclaimer, the term of this patent is extended or adjusted under 35 U.S.C. 154(b) by 43 days.

(21) Appl. No.: 14/566,640

(22) Filed: Dec. 10, 2014

(65) Prior Publication Data
US 2015/0163914 A1 Jun. 11, 2015

(30) Foreign Application Priority Data
Dec. 10, 2013 (DE) .................. 10 2013 113 764

(51) Int. Cl.
| | | |
|---|---|---|
| H05K 5/00 | (2006.01) | |
| H05K 1/18 | (2006.01) | |
| H01L 23/10 | (2006.01) | |
| H01L 23/498 | (2006.01) | |
| H01L 23/057 | (2006.01) | |
| H01L 25/07 | (2006.01) | |
| H01L 23/055 | (2006.01) | |

(52) U.S. Cl.
CPC ............. *H05K 1/181* (2013.01); *H01L 23/055* (2013.01); *H01L 23/057* (2013.01); *H01L 23/10* (2013.01); *H01L 23/49861* (2013.01); *H01L 25/072* (2013.01); *H01L 2924/0002* (2013.01)

(58) Field of Classification Search
USPC ............. 361/728–730, 752, 736, 301.1, 302, 361/679.31, 679.32, 820, 783–785; 174/8, 174/24, 28, 30, 151, 139, 142; 315/56, 58, 315/59, 60, 246, 267, 289; 333/245, 260; 429/122, 174, 178, 181; 257/698, 776, 257/777, 778
See application file for complete search history.

(56) References Cited

U.S. PATENT DOCUMENTS

| | | | |
|---|---|---|---|
| 4,788,626 A | 11/1988 | Neidig | |
| 5,070,314 A * | 12/1991 | Decker | ................... H01P 1/045 333/260 |
| 6,304,447 B1 * | 10/2001 | Bortolini | ............ H05K 7/20236 165/104.33 |
| 7,595,562 B2 * | 9/2009 | Mizuno | ................ B41J 2/14233 257/734 |
| 7,944,701 B2 | 5/2011 | Popp | |
| 2007/0194429 A1 * | 8/2007 | Lederer | ................... H01L 24/72 257/688 |

(Continued)

FOREIGN PATENT DOCUMENTS

| | | |
|---|---|---|
| DE | 10 2005 036 105 | 11/2006 |
| DE | 10 2007 007 224 | 8/2008 |

*Primary Examiner* — Hung S Bui
(74) *Attorney, Agent, or Firm* — The Law Offices of Roger S. Thompson

(57) ABSTRACT

A power semiconductor device comprising a first housing having a cutout with an opening, and a second housing. The device has a load element having external and internal sections, and a feedthrough section pressing through the opening. The feedthrough section has a first outer edge region which tapers laterally towards a first outer edge thereof and a second outer edge region which tapers laterally towards a second outer edge thereof. The first and second outer edge regions face away from one another. The first outer edge is near the lateral first end of the opening and the second outer edge is near the lateral second end of the opening. A first seal is positioned between the first housing and the feedthrough section and a second seal is positioned between the second housing and the feedthrough section. The seals contact one another laterally from the first and second outer edges.

13 Claims, 5 Drawing Sheets

(56) References Cited

U.S. PATENT DOCUMENTS

2013/0081849 A1* 4/2013 Simmons ............... H01R 9/223
174/50.5

2013/0277820 A1* 10/2013 Hotta .................. H01L 23/4006
257/712

* cited by examiner

POWER SEMICONDUCTOR DEVICE

BACKGROUND OF THE INVENTION

1. Field of the Invention

The invention relates to a power semiconductor device.

2. Description of the Related Art

Known power semiconductor devices, generally power semiconductor components such as, for example, power semiconductor switches and diodes are arranged on a substrate and are electrically conductively connected to one another by means of a conductor layer of the substrate and bonding wires and/or a foil composite. In this case, the power semiconductor switches are generally present in the form of transistors, such as, e.g., IGBTs (Insulated Gate Bipolar Transistor) or MOSFETs (Metal Oxide Semiconductor Field Effect Transistor), or in the form of thyristors.

In this case, the power semiconductor components arranged on the substrate are often electrically interconnected to form one or more so-called half-bridge circuits, which are used, e.g., for rectifying and inverting electrical voltages and currents.

Conventional power semiconductor devices also have load terminal elements for carrying load currents. With the aid of such load terminal elements, the power semiconductor devices can be electrically conductively connected to external components. In this case, the load currents generally have a higher current intensity, compared to auxiliary currents serving, e.g., for driving the power semiconductor switches. The load terminal elements generally have to be led through the housing of the power semiconductor device. In this case, power semiconductor devices often have to comply with the requirement of being protected, e.g., against splash water (e.g. IP54), such that the load terminal elements have to sealed with respect to the housing. In the case of conventional power semiconductor devices, the load terminal elements are led through a cutout in the housing and sealed with respect to the housing by means of a silicone sealing compound and/or further sealing elements. Owing to the conventional rectangular contour of known load terminal elements, at the edges of the load terminal elements there are often small regions, or gaps, where no sealing material is present or such gaps form over the course of time. Because of such gaps, the load terminal elements are insufficiently sealed with respect to the housing, leading to problems in the operation of the power semiconductor device.

SUMMARY OF THE INVENTION

The object of the invention is to provide an improved power semiconductor device which overcomes the drawbacks of the prior art.

It is a further object of the invention to provide a power semiconductor device in which at least one load terminal element is reliably sealed with respect to the housing of the power semiconductor device.

This object is achieved by means of a power semiconductor device comprising a substrate and power semiconductor components arranged on the substrate and connected to the substrate. The power semiconductor device has a housing, which has a first housing part having a first cutout and a second housing part. The second housing part is arranged relative to the first housing part in such a way that an opening in the housing forms through the first cutout. The power semiconductor device has an electrically conductive load terminal element, for permitting electrical contact with the power semiconductor device, the load terminal element having an external terminal section which is located outside the housing, an internal terminal section located inside the housing and a feedthrough section pressing through the opening. The feedthrough section has a first outer edge region which tapers laterally in the direction of a first outer edge of the feedthrough section and a second outer edge region which tapers laterally in the direction of a second outer edge of the feedthrough section. The first and second outer edge regions are arranged to face away from one another. The first outer edge is arranged in the region of the lateral first end of the opening. The second outer edge is arranged in the region of the lateral second end of the opening. A first section of a first sealing element is arranged between the first part and the feedthrough section and a first section of a second sealing element is arranged between the second housing part and the feedthrough section. The first and second sealing elements have a contact with one another laterally from the first and second outer edges.

It proves to be advantageous if the geometrical shape of the feedthrough section is defined by having an outer surface of the feedthrough section face the first housing part and by an outer surface of the feedthrough section facing the second housing part, wherein the outer surface facing the first housing part has a curve course with two turning points in the region between first and second outer edges in the direction from the first to the second outer edge. The first turning point is arranged between the first outer edge and a point of the curve course whose perpendicular distance from the first outer edge corresponds to half the distance between the first and second outer edges, wherein the second turning point is arranged between the second outer edge and the point of the curve course whose perpendicular distance from the first outer edge corresponds to half the distance between the first and second outer edges. As a result, the geometrical shape of the feedthrough section has a course against which the first and second sealing elements can nestle well, with the result that a particularly reliable sealing of the load terminal element with respect to the housing of the power semiconductor device is obtained.

It proves to be advantageous if the geometrical shape of the feedthrough section is embodied such that it is mirror-symmetrical relative to an imaginary first plane that extends in the Y-direction and Z-direction and is spaced apart identically from the first and second outer edges. As a result, the first and second sealing elements can nestle well against the opening and against the feedthrough section, with the result that a very reliable sealing of the load terminal element with respect to the housing of the power semiconductor device is obtained.

It further proves to be advantageous if the second housing part has a second cutout, wherein the second housing part is arranged in relation to the first housing part in such a way that the second cutout is arranged above the first cutout and the opening in the housing forms through the first and second cutouts. As a result, a very reliable sealing of the load terminal element with respect to the housing of a power semiconductor device is obtained.

Furthermore, it proves to be advantageous if the geometrical shape of the feedthrough section is defined by an outer surface of the feedthrough section which faces the first housing part and of an outer surface of the feedthrough section which faces the second housing part, wherein the outer surface facing the first housing part and the outer surface facing the second housing part each have a respective curve course having two turning points in the region between first and second outer edges in the direction from the first to the second outer edge, wherein the respective first turning point is arranged between the first outer edge and a point of the respective curve course whose perpendicular distance from the first outer edge corresponds to half the distance between the first and second outer edges, and the respective second turning point is arranged between the second outer edge and that point of the respective curve course whose perpendicular distance from the first outer edge corresponds to half the distance between the first and second outer edges. As a result, the geometrical shape of the feedthrough section has a course against which the first and second sealing elements can nestle well, with the result that a particularly reliable sealing of the load terminal element with respect to the housing of the power semiconductor device is obtained.

Furthermore, it proves to be advantageous if the geometrical shape of the feedthrough section is embodied such that it is mirror-symmetrical relative to an imaginary second plane that extends in the X-direction and Z-direction and runs through the first and second outer edges, and is embodied such that it is mirror-symmetrical relative to an imaginary first plane that extends in the Y-direction and Z-direction and is spaced apart identically from the first and second outer edges. As a result, the first and second sealing elements can nestle against the opening and against the feedthrough section particularly well, with the result that a particularly reliable sealing of the load terminal element with respect to the housing of the power semiconductor device is obtained.

It proves to be advantageous if the geometrical shape of the feedthrough section is defined by an outer surface of the feedthrough section which faces the first housing part and by an outer surface of the feedthrough section which faces the second housing part, wherein the outer surfaces facing the first housing part and the second housing part have a continuously differentiable curve course in the region between first and second outer edges in the direction from the first to the second outer edge, since then the respective outer surface in the region between the first and second outer edges has no edges at which there is the risk of no sealing material being present.

Furthermore, it proves to be advantageous if the geometrical shape of the feedthrough section is defined by an outer surface of the feedthrough section which faces the first housing part and by an outer surface of the feedthrough section which faces the second housing part wherein the outer surface facing the first housing part and the outer surface facing the second housing part are at an angle of a maximum of about 30° with respect to one another at the first and second outer edges, since then, with particularly high certainty, there are no regions where no sealing material is present and such regions do not form over the course of time.

Furthermore, it proves to be advantageous if the geometrical shape of the opening and the geometrical shape of the feedthrough section are complementary to one another. As a result, the first and second sealing elements can nestle against the opening and against the feedthrough section particularly, with the result that a particularly reliable sealing of the load terminal element with respect to the housing of the power semiconductor device is obtained.

Furthermore, it proves to be advantageous if the first and second outer edges of the feedthrough section are set back relative to that lateral contour of the internal terminal section and of the external terminal section which adjoins the feedthrough section. Setting back the outer edges of the feedthrough section makes it possible reliably to prevent damage to the outer edges and injuries to persons caused by the outer edges.

Furthermore, it proves to be advantageous if the first sealing element is cohesively connected to the first housing part and/or the second sealing element is cohesively connected to the second housing part, since that simplifies the construction of the power semiconductor device.

Furthermore, it proves to be advantageous if the geometrical shape of the feedthrough section is defined by an outer surface of the feedthrough section which faces the first housing part and by an outer surface of the feedthrough section which faces the second housing part, wherein the outer surface which faces the first housing part and/or the outer surface which faces the second housing part are/is embodied in the shape of an eyebrow dormer, since then the first and second sealing elements can nestle against the opening and against the feedthrough section particularly well.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

DETAILED DESCRIPTION OF THE PRESENTLY PREFERRED EMBODIMENTS

Figure 1:
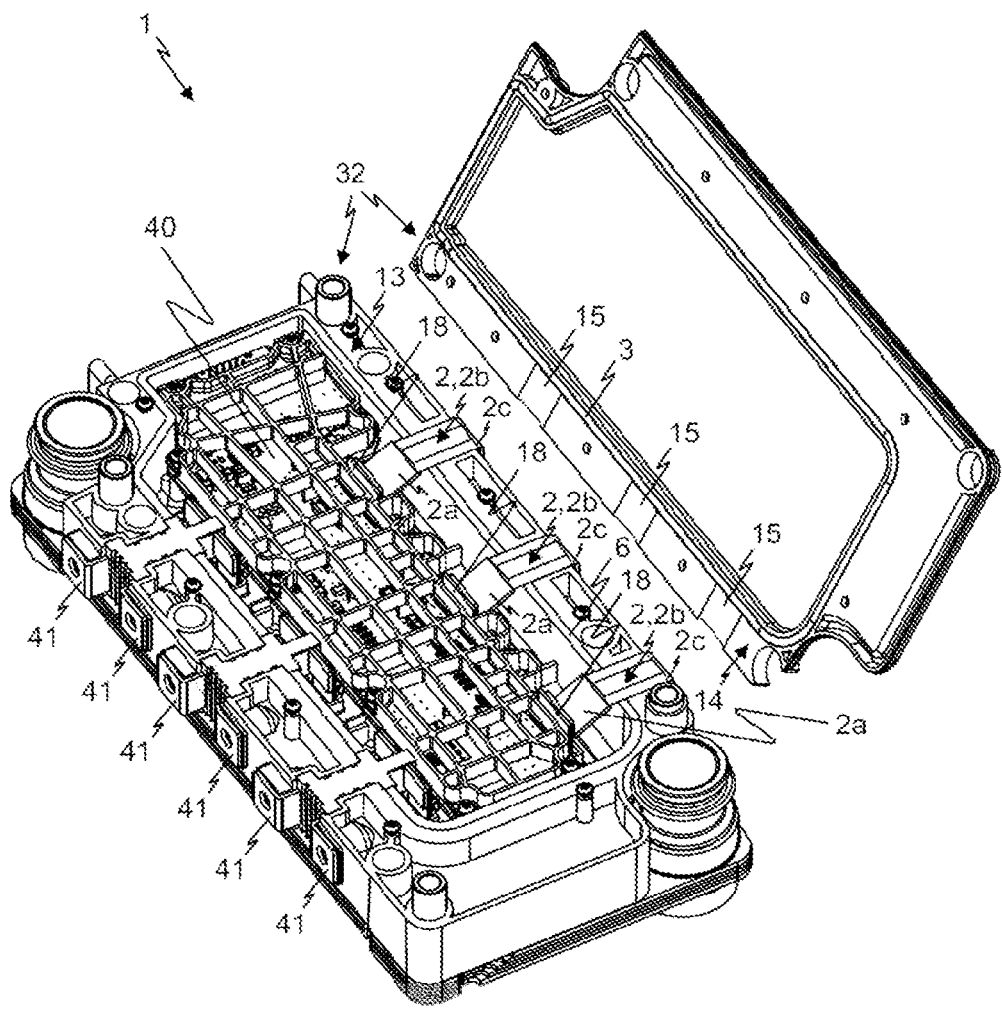
FIG. 1 shows a perspective illustration of a power semiconductor device according to the invention with the second housing part detached.
Figure 2:
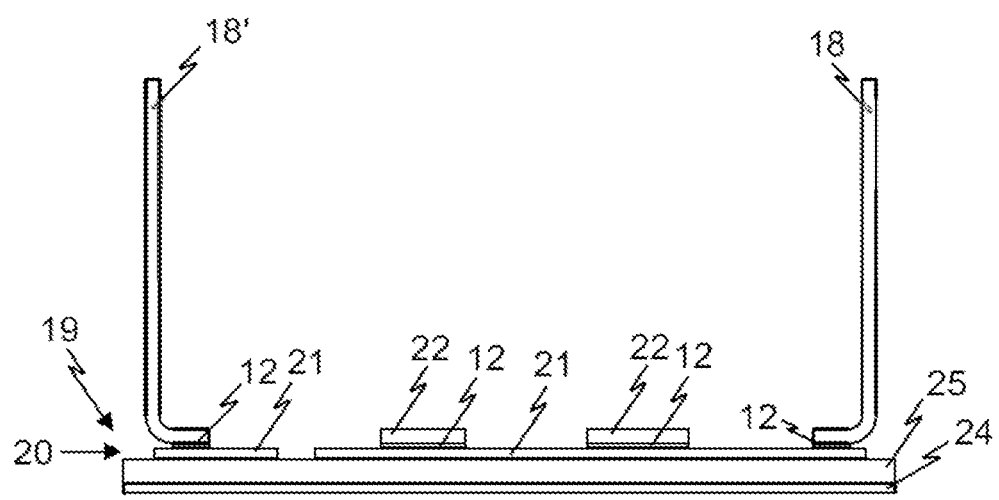
FIG. 2 shows a schematic sectional illustration of a substrate of the power semiconductor device according to the invention and of the elements of the power semiconductor device that are connected to the substrate.

FIG. 1 illustrates a perspective illustration of a power semiconductor device 1 according to the invention with a second housing part 14 detached. FIG. 2 illustrates a schematic sectional illustration of a substrate 19 of power semiconductor device 1 and of the elements of power semiconductor device 1 that are connected to substrate 19. Power semiconductor device 1 has a housing 32, which has a first housing part 13, which preferably laterally encloses power semiconductor components 22 of power semiconductor device 1. In the exemplary embodiment, power semiconductor device 1 has three load terminal elements 2 for permitting the electrically contact-connecting of power semiconductor device 1 to external electrical conduction devices, such as, e.g., geometrically conductive rails or cables. By means of load terminal elements 2, load currents are carried through a housing of power semiconductor device 1. In the exemplary embodiment, the load currents are present in the form of alternating currents.

It should be noted at this juncture that, in the context of the exemplary embodiment, a DC voltage is inverted into a 3-phase AC voltage or a 3-phase AC voltage is rectified in a DC voltage by means of power semiconductor device 1. For simplicity of illustration, the following description here describes by way of example the construction of power semiconductor device 1, with regard to a substrate and the elements assigned to the substrate, regarding the generation of a 1-phase AC voltage. In this case, substrate 19 or the arrangement illustrated in FIG. 2 for generating the 1-phase AC voltage is present threefold in identical embodiment, such that, as already described above, a 3-phase AC voltage is generated from a DC voltage or a 3-phase AC voltage is rectified into a DC voltage by power semiconductor device 1 in the exemplary embodiment. Power semiconductor device 1 has a substrate 19 and power semiconductor components 22 arranged on and connected to substrate 19. The respective power semiconductor component is preferably present in the form of a power semiconductor switch or a diode. In this case, the power semiconductor switches are generally present in the form of transistors, such as, e.g., IGBTs (Insulated Gate Bipolar Transistors) or MOSFETs (Metal Oxide Semiconductor Field Effect Transistors), or in the form of thyristors.

Substrate 19 has an insulating material body 25 and an electrically conductive structured first conduction layer 20 arranged on a first side of insulating material body 25 and connected to insulating material body 25, conduction layer 20 forming conductor tracks 21 in the context of the exemplary embodiment. Preferably, substrate 19 has an electrically conductive, preferably unstructured second conduction layer 24, wherein insulating material body 25 is arranged between structured first conduction layer 20 and second conduction layer 24. Substrate 19 can be present, e.g., in the form of a direct copper bonded substrate (DCB substrate) or in the form of an Insulated Metal Substrate (IMS).

Furthermore, power semiconductor device 1 has an electrically conductive connection element 18, which connects substrate 19, to put it more precisely first conduction layer 20 of substrate 19, to electrically conductive load terminal element 2. As illustrated in FIG. 1, in the exemplary embodiment, load terminal element 2 is connected to connection element 18. Load terminal element 2 is electrically conductively connected to at least one power semiconductor component 22. However, load terminal element 2 can, e.g., also be directly connected to substrate layer 19 or to a power semiconductor component 22. Furthermore, power semiconductor device 1 in the exemplary embodiment has two electrically conductive further connection elements 18', which connect substrate 19, to put it more precisely first conduction layer 20 of substrate 19 to assigned electrically conductive DC voltage load terminal elements 41. Preferably, the connection between the abovementioned elements is realized in each case as a cohesive connection (e.g., a soldering or sintering connection) or as a force-locking connection, the respective connection there being provided with the reference sign 12 in FIG. 2. In this case, the load currents flowing through load terminal element 2 and through DC voltage load terminal elements 41 generally have a high current intensity, in contrast to auxiliary currents serving, e.g., for guiding the power semiconductor components if the power semiconductor components are embodied as power semiconductor switches.

It should furthermore be noted that power semiconductor components 22 are electrically conductively connected to one another at their side facing away from substrate 19, by means of, e.g., bonding wires and/or a foil composite, and to conductor tracks 21 of substrate 19, in accordance with the desired electrical circuit which is intended to realize power semiconductor device 1. For the sake of clarity, the electrical connections are not illustrated in FIG. 2.

As illustrated in FIG. 1, power semiconductor device 1 preferably has a printed circuit board 40, on which the electrical driver circuit required for driving power semiconductor switches 22 of power semiconductor device 1 are realized.

Power semiconductor device 1 has a housing 32, which has a first housing part 13 and a second housing part 14. First and second housing parts 13, 14 are preferably each made of a thermoplastic. In the context of the exemplary embodiment, first housing part 13 laterally encloses power semiconductor components 22 of power semiconductor device 1. Second housing part 14 is preferably embodied as a cover. In the context of the exemplary embodiment, second housing part 14 is connected to first housing part 13 by a screw connection. Alternatively, second housing part 14 could be connected to first housing part 13 also, e.g., by means of a snap-action latching connection or some other type of connection.

Figure 3:
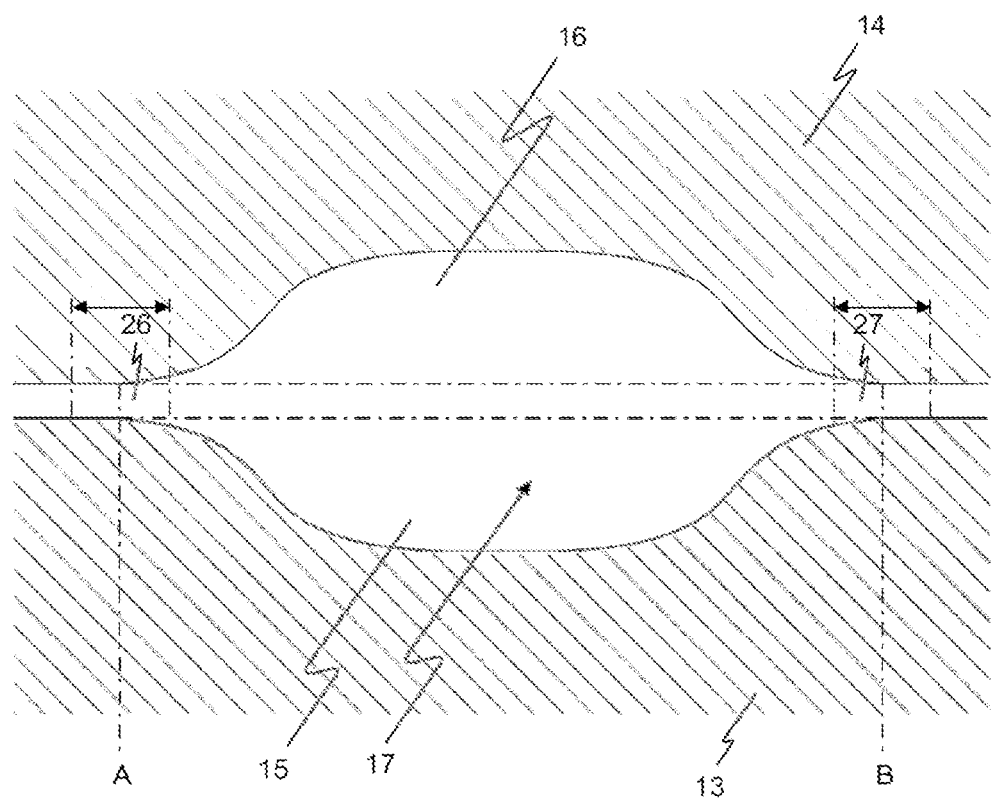
FIG. 3 shows a sectional illustration of an excerpt from a first and second housing part of the power semiconductor device according to the invention, wherein the elements arranged between the first and second housing parts are omitted.

FIG. 3 illustrates a sectional illustration of an excerpt from first and second housing parts 13, 14 when second housing part 14 is connected to first housing part 13, wherein the elements arranged between first and second housing parts 13, 14 are omitted.

First housing part 13 has a first cutout 15 and second housing part 14 has a second cutout 16. Second housing part 14 is arranged relative to first housing part 13 in such a way that second cutout 16 is arranged above first cutout 15 and an opening 17 in the housing is formed through first and second cutouts 15, 16. Opening 17 has a lateral first end A and a lateral second end B. Lateral first end A and lateral second end B of opening 17 coincide with the lateral ends of first and second cutouts 15, 16. Opening 17 runs between first and second ends A, B of opening 17. In the exemplary embodiment, the lateral direction is the X-direction (see, FIGS. 5 and 6).

Figure 4:
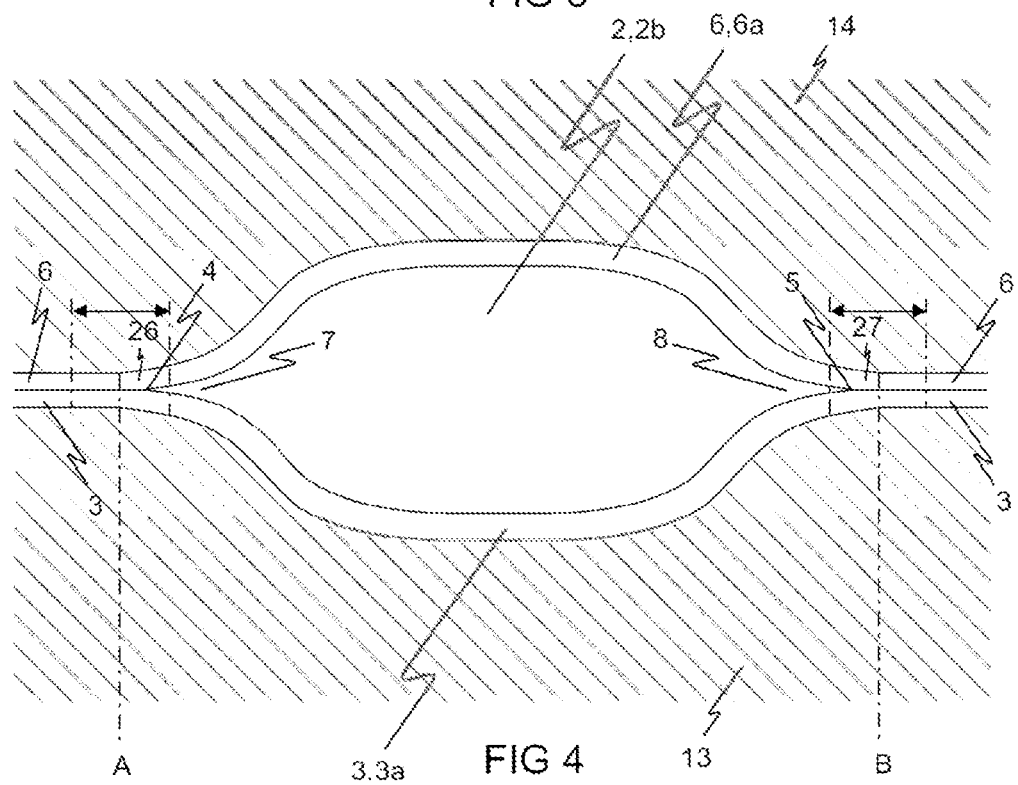
FIG. 4 shows a sectional illustration of the excerpt from the first and second housing parts illustrated in FIG. 3, wherein the elements arranged between the first and second housing parts are concomitantly illustrated.
Figure 5:
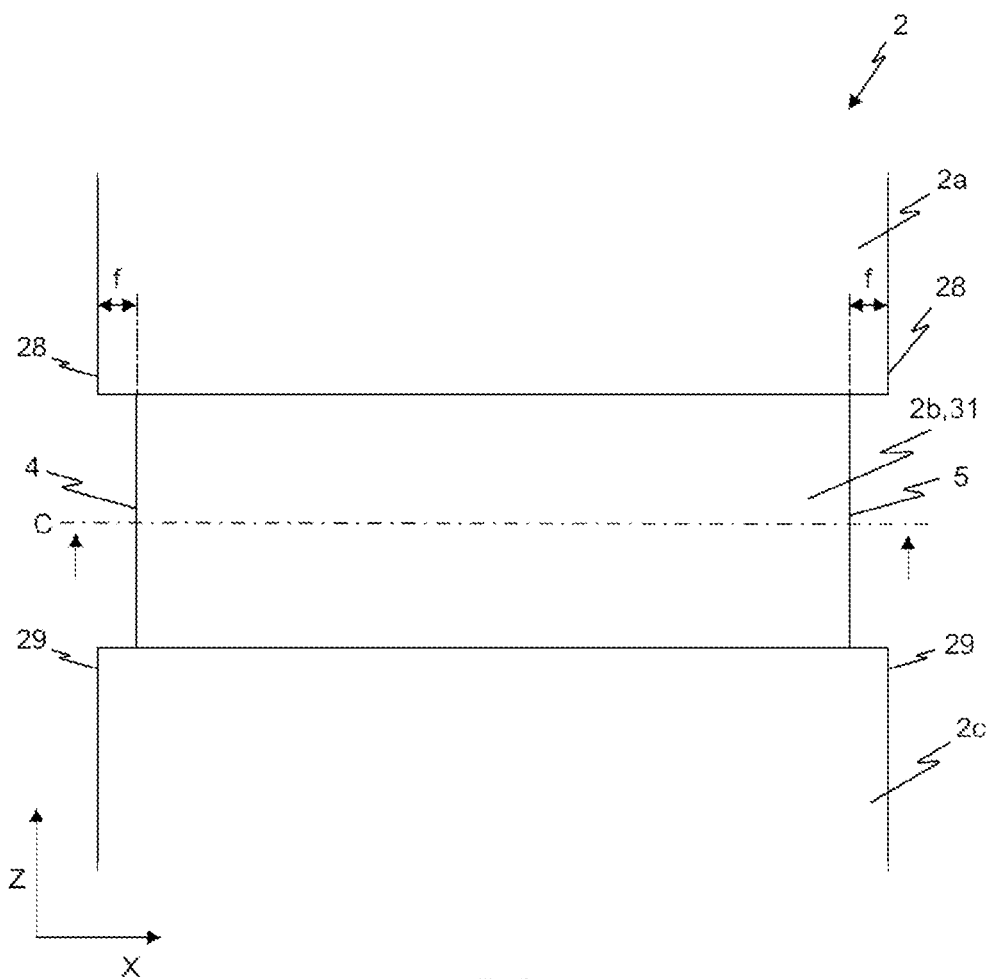
FIG. 5 shows a schematic view of the load terminal element from above.
Figure 6:
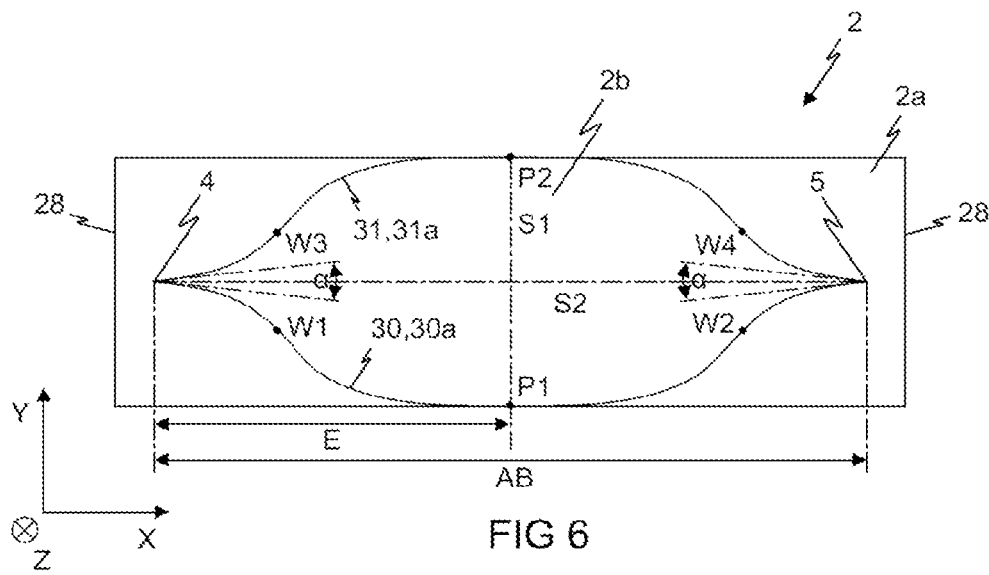
FIG. 6 shows a sectional illustration of the load terminal element.

FIG. 4 illustrates a sectional illustration of the excerpt from first and second housing parts 13, 14 illustrated in FIG. 3, wherein the elements arranged between first and second housing parts 13, 14 are concomitantly illustrated. FIG. 5 illustrates a schematic view of load terminal element 2 from above and FIG. 6 illustrates a sectional illustration with load terminal element 2, wherein the section runs along the line C illustrated in FIG. 5. In this case, FIG. 5 illustrates load terminal element 2 in a state not yet angled, said state being illustrated in FIG. 1.

Load terminal element 2 has an external terminal section 2c arranged outside housing 32 of power semiconductor device 1 and an internal terminal section 2a arranged within housing 32 of power semiconductor device 1 and a feedthrough section 2b passing through opening 17. Feedthrough section 2b has a first outer edge region 7 tapering laterally in the direction of a first outer edge 4 of feedthrough section 2b and a second outer edge region 8 tapering laterally in the direction of a second outer edge 5 of feedthrough section 2b. First and second outer edge regions 7, 8 are arranged in a manner facing away from one another and first outer edge 4 is arranged in the region 26 of lateral first end A of opening 17 and second outer edge 5 is arranged in the region 27 of lateral second end B of opening 17. The extent of region 26 of lateral first end A of opening 17 and the extent of region 27 of lateral second end B of opening 17 are indicated by a respective double-headed arrow in FIGS. 3 and 4. Region 26 and respectively 27 comprises a zone arranged laterally somewhat outside opening 17 and a zone arranged laterally somewhat within opening 17, including the relevant end A and respectively B of opening 17.

A first section 3a of a first sealing element 3 is arranged between first housing part 13 and feedthrough section 2b and a first section 6a of a second sealing element 6 is arranged between second housing part 13 and feedthrough section 2b, wherein first and second sealing elements 3, 6 have a contact with one another laterally from first and second outer edges 4, 5. First sealing element 3 seals feedthrough section 2b with respect to first housing part 13 and second sealing element 6 seals feedthrough section 2b with respect to second housing part 14.

First and second sealing elements 3, 6 preferably consist of an elastic material, such as, e.g., silicone or rubber. First sealing element 3 can be cohesive connected to first housing part 13 and/or second sealing element 6 can be cohesively connected to second housing part 14. Alternatively, the first and/or second sealing element 3, 6 can respectively also be realized in the form of a separate sealing element (e.g., as a sealing ring) that is placed between feedthrough section 2b and the respective housing part 13 and/or 14 during the assembly of power semiconductor device 1.

Owing to the first outer edge region tapering laterally outwards in the direction of a first outer edge of the feedthrough section and the second outer edge region tapering laterally outwards in the direction of a second outer edge of the feedthrough section, at the outer edges of the feedthrough section of the load terminal element, there are no regions where no sealing material is present, and no such regions form over the course of time.

In order to produce an electrical contact between power semiconductor device 1 and an external electrical conduction device, such as, e.g., an electrically conductive rail or a cable, the external electrical conduction device is connected to the external terminal section 2c of load terminal element 2.

First and second outer edges 4, 5 preferably have a sharp shape.

First and second outer edges 4, 5 run in the Z-direction (see, FIG. 6). They run parallel to one another in the context of the exemplary embodiment.

The geometrical shape of feedthrough section 2b is preferably defined by an outer surface 30 of feedthrough section 2b which faces first housing part 13 and by an outer surface 31 of feedthrough section 2b which faces second housing part 14, wherein outer surface 30 of feedthrough section 2b facing first housing part 13 and outer surface 31 of feedthrough section 2b facing second housing part 14 have a continuously differentiable curve course in the region between first and second outer edges 4 and 5 in the direction from the first to the second outer edge. Consequently, outer surfaces 30, 31 of feedthrough section 2b in the region between first and second outer edges 4, 5 in the direction from the first to the second outer edge have no edges at which there is the risk of no sealing material being present.

Outer surface 30 of feedthrough section 2b facing first housing part 13 and outer surface 31 of feedthrough section 2b facing second housing part 14 preferably have a respective curve course 30a and 31a having two turning points in the region between first and second outer edges 4, 5 in the direction from the first to the second outer edge, wherein the respective first turning point W1 and W3 is arranged between first outer edge 4 and a point P1 and respectively P2 of the respective curve course 30a and 31a whose perpendicular distance E from first outer edge 4 corresponds to half the distance AB between first and second outer edges 4, 5, wherein the respective second turning point W2 and W4 is arranged between second outer edge 5 and point P1 and respectively P2 of the respective curve course 30a and 31a whose perpendicular distance E from first outer edge 4 corresponds to half the distance E between first and second outer edges 4, 5. In this case, the turning points are those points W1, W2 and W3, W4 on the respective curve course 30a and 31a at which the absolute value of the gradient of the respective curve course 30a and 31a has a local maximum, that is to say that the absolute value of the gradient of the respective curve course 30a and 31a decreases in the region in proximity on the left and right of the respective turning point.

In the context of the exemplary embodiment, outer surface 30 of feedthrough section 2b facing first housing part 13 and outer surface 31 of feedthrough section 2b facing second housing part 14 are at an angle $\alpha$ of a maximum of about 30°, in particular of a maximum of about 20°, with respect to one another at first and second outer edges 4, 5.

The geometrical shape of opening 17 and the geometrical shape of feedthrough section 2b are preferably embodied such that they are complementary to one another. The geometrical shape of opening 17 thus follows the geometrical shape of feedthrough section 2b, and vice versa.

In the exemplary embodiment, the geometrical shape of feedthrough section 2b is embodied such that it is mirror-symmetrical relative to an imaginary second plane S2 that extends in the X-direction and Z-direction and runs through first and second outer edges 4, 5, and is embodied such that it is mirror-symmetrical relative to an imaginary first plane S1 that extends in the Y-direction and Z-direction and is spaced apart identically from first and second outer edges 4, 5.

Outer surface 30 of feedthrough section 2b facing first housing part 13 and/or outer surface 31 of feedthrough section 2b of the load terminal element facing second housing part 14 can be embodied in the shape of an eyebrow dormer.

As illustrated in FIG. 5, in the context of the exemplary embodiment, first and second outer edges 4, 5 of feedthrough section 2b are set back relative to that lateral contour of internal terminal section 2a and of external terminal section 2c which adjoins feedthrough section 2b. In this case, first and second outer edges 4, 5 of feedthrough section 2b are set back by the length f relative to the lateral contour of internal terminal section 2a and of external terminal section 2c adjoining feedthrough section 2b. In the exemplary embodiment, the lateral contour of internal terminal section 2a is present in the form of lateral outer surfaces 28 of internal terminal section 2a and the lateral contour of external terminal section 2c is present in the form of the lateral outer surfaces 29 of external terminal section 2c. Setting back outer edges 4, 5 makes it possible reliably to prevent damage to outer edges 4, 5 and injuries to persons caused by outer edges 4, 5 during the assembly of power semiconductor device 1.

Figure 7:
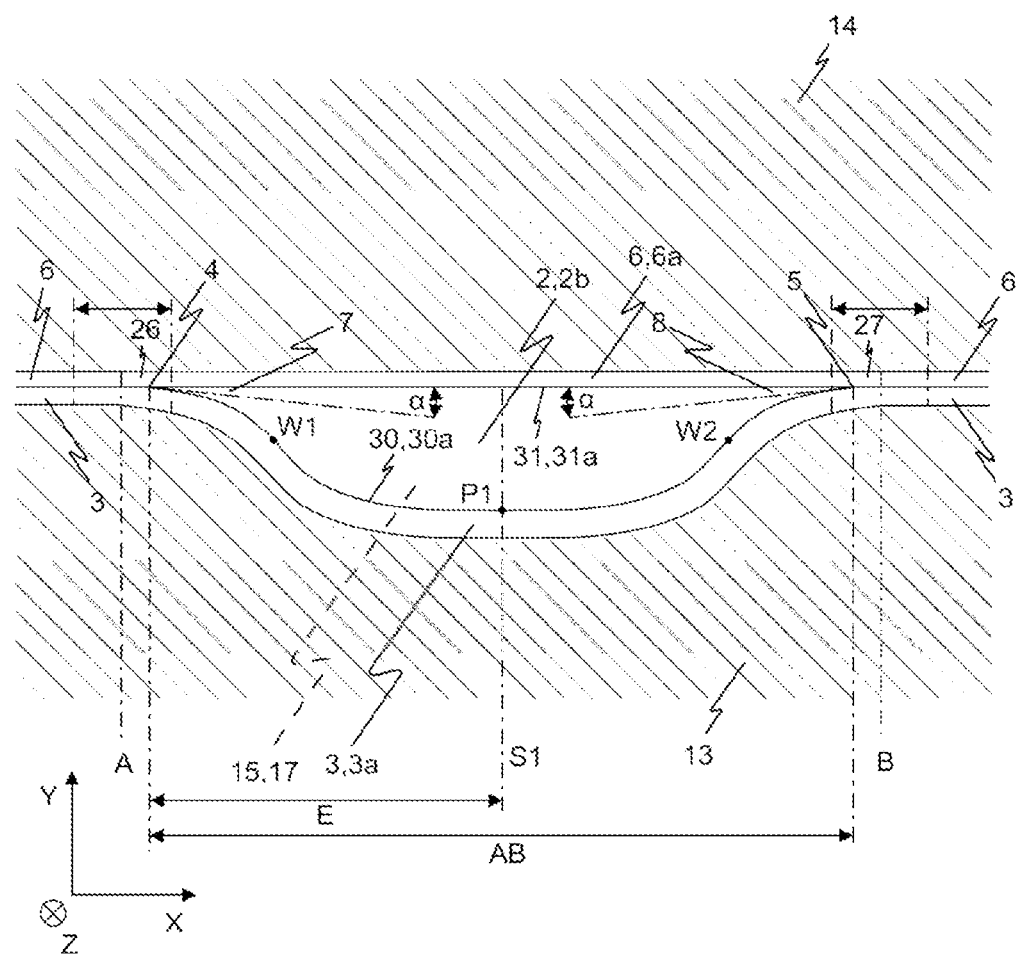
FIG. 7 shows a sectional illustration of the first and second housing parts of a further embodiment of a power semiconductor device according to the invention, wherein the elements arranged between the first and second housing parts are concomitantly illustrated.

FIG. 7 illustrates the sectional illustration of a first and second housing part 13 and 14 of a further embodiment of a power semiconductor device 1 according to the invention, wherein the elements arranged between first and second housing parts 13, 14 are concomitantly illustrated. Power semiconductor device 1 according to the invention in accordance with FIG. 7 is analogous to the above-described power semiconductor device 1 according to the invention in accordance with FIGS. 1 to 6, apart from the feature that second housing part 13 has no second cutout arranged above first cutout 15, and thus there is no second cutout through which opening 17 in the housing of power semiconductor device 1 according to the invention is concomitantly formed. In FIG. 7, identical elements are provided with the same reference signs as in FIGS. 1 to 6. In the context of the exemplary embodiments illustrated in FIG. 7, feedthrough section 2b of load terminal element 2 in accordance with FIG. 7 corresponds to the lower half of feedthrough section 2b of load terminal element 2 illustrated in FIGS. 4 to 6. Curve course 31a of outer surface 31 of feedthrough section 2b facing second housing part 14 in accordance with FIG. 7 is preferably reduced to a straight line. Outer surface 30 facing first housing part 13 and outer surface 31 facing second housing part 14 are preferably at an angle α of a maximum of about 30°, preferably a maximum of about 20°, more preferably a maximum of about 15°, and most preferably a maximum of about 10°, with respect to one another at first and second outer edges 4, 5.

In the preceding Detailed Description, reference was made to the accompanying drawings, which form a part of his disclosure, and in which are shown illustrative specific embodiments of the invention. In this regard, directional terminology, such as "top", "bottom", "left", "right", "front", "back", etc., is used with reference to the orientation of the Figure(s) with which such terms are used. Because components of embodiments can be positioned in a number of different orientations, the directional terminology is used for purposes of ease of understanding and illustration only and is not to be considered limiting.

Additionally, while there have been shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A power semiconductor device comprising:
   a housing with first and second housing parts, said first housing part having a first cutout, said first and second housing parts being configured to form an opening in said housing through said first cutout, said opening having lateral first and second ends;
   an electrically conductive load terminal element for permitting electrical contact with the power semiconductor device, said electrically conductive load terminal element having an external terminal section arranged outside said housing, an internal terminal section arranged inside said housing and a feedthrough section pressing through said opening, said feedthrough section having first and second outer edges, and first and second outer edge regions;
   a first sealing element having a first section which is arranged between said first housing part and said feedthrough section; and
   a second sealing element having a first section which is arranged between said second housing part and said feedthrough section;
   wherein said first and second sealing elements contact one another laterally from said first and second outer edges of said feedthrough section;
   wherein said first outer edge region tapers laterally in the direction of said first outer edge and said second outer edge region tapers laterally in the direction of said second outer edge; and
   wherein said first and second outer edge regions are disposed so as to face away from one another, said first outer edge is arranged proximate said lateral first end of said opening and said second outer edge is arranged proximate said lateral second end of said opening.

2. The power semiconductor device of claim 1,
   wherein said feedthrough section has a geometric shape which is defined by a first outer surface of said feedthrough section facing said first housing part and by a second outer surface of said feedthrough section facing said second housing part;
   wherein said first outer surface facing said first housing part has a curve course with first and second turning points in a region between said first and second outer edges of said feedthrough section in the direction from said first to said second outer edge;
   wherein said first turning point is positioned between said first outer edge and a point on the curve course whose perpendicular distance from said first outer edge corresponds to approximately half the distance between said first and second outer edges; and
   wherein said second turning point is positioned between said second outer edge and a point on said curve course whose perpendicular distance from said first outer edge corresponds to approximately half the distance between said first and second outer edges.

3. The power semiconductor device of claim 1, wherein said geometrical shape of said feedthrough section is embodied such that it is mirror-symmetrical relative to an imaginary first plane that extends in the Y-direction and Z-direction and is spaced apart approximately evenly from said first and second outer edges.

4. The power semiconductor device of claim 1, wherein said second housing part has a second cutout which is positioned above said first cutout, and said opening includes said first and second cutouts.

5. The power semiconductor device of claim 4,
   wherein said feedthrough section has a geometric shape which is defined by a first outer surface of said feedthrough section facing said first housing part and by a second outer surface of said feedthrough section facing said second housing part;
   wherein said first outer surface facing said first housing part has a first curve course with first and second turning points in a region between said first and second outer edges of said feedthrough section in the direction from said first to said second outer edge;

wherein said first turning point is positioned between said first outer edge and a point on said first curve course whose perpendicular distance from said first outer edge corresponds to approximately half the distance between said first and second outer edges;

wherein said second turning point is positioned between said second outer edge and a point on said first curve course whose perpendicular distance from said first outer edge corresponds to approximately half the distance between said first and second outer edges;

wherein said first outer surface facing said second housing part has a second curve course with third and fourth turning points in a region between said first and second outer edges of said feedthrough section in the direction from said first to said second outer edge;

wherein said third turning point is positioned between said first outer edge and a point on said second curve course whose perpendicular distance from said first outer edge corresponds to approximately half the distance between said first and second outer edges; and wherein said fourth turning point is positioned between said second outer edge and a point on said second curve course whose perpendicular distance from said first outer edge corresponds to approximately half the distance between said first and second outer edges.

6. The power semiconductor device of claim 4,
wherein said geometrical shape of said feedthrough section is embodied such that it is mirror-symmetrical relative to an imaginary first plane that extends in the Y-direction and Z-direction and is spaced apart approximately evenly from said first and second outer edges; and wherein said geometrical shape of said feedthrough section is embodied such that it is also mirror-symmetrical relative to an imaginary second plane that extends in the X-direction and Z-direction and runs through said first and second outer edges.

7. The power semiconductor device of claim 1,
wherein said feedthrough section has a geometric shape which is defined by a first outer surface of said feedthrough section facing said first housing part and by a second outer surface of said feedthrough section facing said second housing part; and wherein said first and second outer surfaces each have a continuously differentiable curve course in a region between said first and second outer edges in the direction from said first to said second outer edge.

8. The power semiconductor device of claim 1,
wherein said feedthrough section has a geometric shape which is defined by a first outer surface of said feedthrough section facing said first housing part and by a second outer surface of said feedthrough section facing said second housing part; and wherein said first outer surface and said second outer surface are at an angle $\alpha$ of no more than about 30° with respect to one another at said first and second outer edges.

9. The power semiconductor device of claim 1, wherein said opening and said feedthrough section are complementary in shape to one another.

10. The power semiconductor device of claim 1, wherein said first and second outer edges of said feedthrough section are set back relative a portion of said internal terminal section and a portion of said external terminal section which adjoin said feedthrough section.

11. The power semiconductor device of claim 1, wherein said first sealing element is cohesively connected to said first housing part.

12. The power semiconductor device of claim 11, wherein said second sealing element is cohesively connected to said second housing part.

13. The power semiconductor device of claim 1, wherein said second sealing element is cohesively connected to said second housing part.

* * * * *